(12) United States Patent
Shimada

(10) Patent No.: US 12,234,094 B2
(45) Date of Patent: Feb. 25, 2025

(54) SUBSTRATE HOLDER AND SUBSTRATE PROCESSING APPARATUS

(71) Applicant: Tokyo Electron Limited, Tokyo (JP)

(72) Inventor: Koichi Shimada, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 321 days.

(21) Appl. No.: 17/811,373

(22) Filed: Jul. 8, 2022

(65) Prior Publication Data

US 2023/0018009 A1    Jan. 19, 2023

(30) Foreign Application Priority Data

Jul. 19, 2021   (JP) .................................. 2021-119079

(51) Int. Cl.
  *B65G 1/14*    (2006.01)
(52) U.S. Cl.
  CPC ........ *B65G 1/14* (2013.01); *B65G 2201/0297* (2013.01)
(58) Field of Classification Search
  CPC ...................... H01L 21/67303; H01L 21/6732
  See application file for complete search history.

(56) References Cited

U.S. PATENT DOCUMENTS

| 2006/0249080 | A1* | 11/2006 | Zehavi ............. H01L 21/67303 118/725 |
| 2018/0105936 | A1* | 4/2018 | Nagano .............. H01L 21/0217 |
| 2023/0033715 | A1* | 2/2023 | Shimada .......... H01L 21/67303 |

FOREIGN PATENT DOCUMENTS

| CN | 115662928 A | * | 1/2023 |
| JP | 2013175641 A | * | 9/2013 |
| JP | 2018-067582 A |   | 4/2018 |

* cited by examiner

*Primary Examiner* — Kaitlin S Joerger
(74) *Attorney, Agent, or Firm* — Armstrong Teasdale LLP

(57) ABSTRACT

A substrate holder includes a first boat configured to hold a substrate in a shelf-like manner, and a second boat coaxial with the first boat and provided to move up and down relative to the first boat. The second boat holds a substrate in a shelf-like manner. The first boat includes a first bottom plate and a first ceiling plate provided to face each other, a first support column connecting the first bottom plate and the first ceiling plate to each other, and a first placement surface on which the substrate is placed. The second boat includes a second bottom plate and a second ceiling plate provided to vertically face each other, a second support column connecting the second bottom plate and the second ceiling plate, and a second placement surface on which the substrate is placed. The second ceiling plate overlaps the first ceiling plate in a plan view.

17 Claims, 10 Drawing Sheets

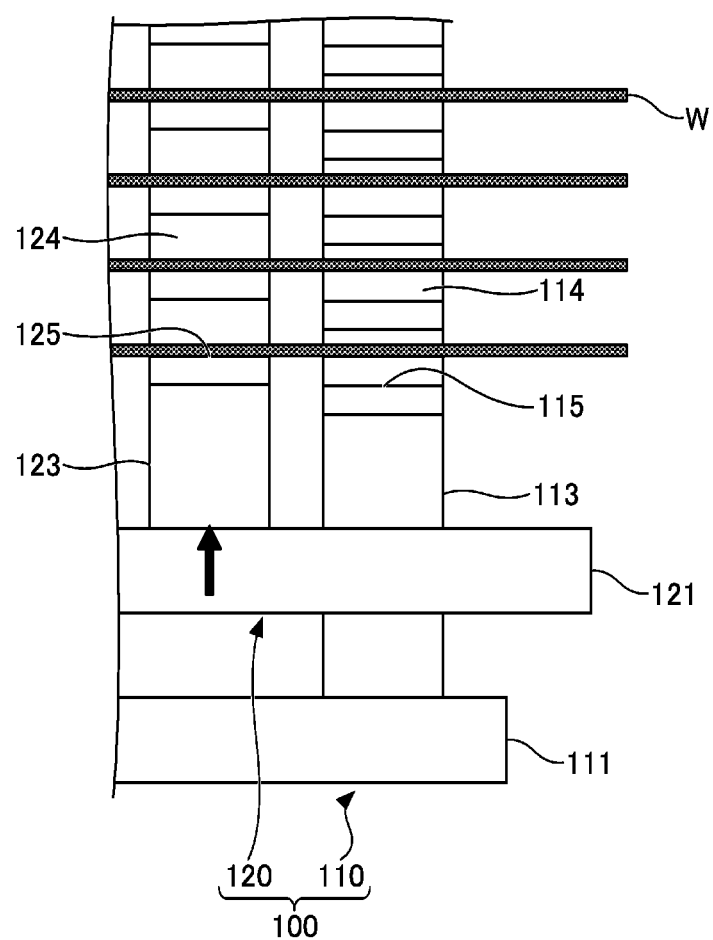

SUBSTRATE HOLDER AND SUBSTRATE PROCESSING APPARATUS

CROSS-REFERENCE TO RELATED APPLICATION

This application is based upon and claims the benefit of priority from Japanese Patent Application No. 2021-119079, filed on Jul. 19, 2021, the entire contents of which are incorporated herein by reference.

TECHNICAL FIELD

The present disclosure relates to a substrate holder and a substrate processing apparatus.

BACKGROUND

There is known an apparatus that accommodates therein a boat loaded with a plurality of substrates and performs a film forming process on the plurality of substrates (see, for example, Patent Document 1). Patent Document 1 describes a boat having a double structure having an inner boat and an outer boat that are independently movable in the vertical direction.

PRIOR ART DOCUMENT

Patent Document

Patent Document 1: Japanese Laid-Open Patent Publication No. 2018-67582

SUMMARY

According to one embodiment of the present disclosure, there is provided a substrate holder including: a first boat configured to hold a substrate in a shelf-like manner, and a second boat coaxial with the first boat and provided to move up and down relative to the first boat, the second boat configured to hold the substrate in a shelf-like manner, wherein the first boat includes a first bottom plate and a first ceiling plate provided to vertically face each other, a first support column connecting the first bottom plate and the first ceiling plate to each other, and a first placement surface on which the substrate is placed, wherein the second boat includes a second bottom plate and a second ceiling plate provided to vertically face each other, a second support column connecting the second bottom plate and the second ceiling plate, and a second placement surface on which the substrate is placed, and wherein the second ceiling plate is arranged to overlap the first ceiling plate in a plan view.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 11 is a side view illustrating the substrate holder in a state in which substrates are held by the second boat.

DETAILED DESCRIPTION

Figure 1:
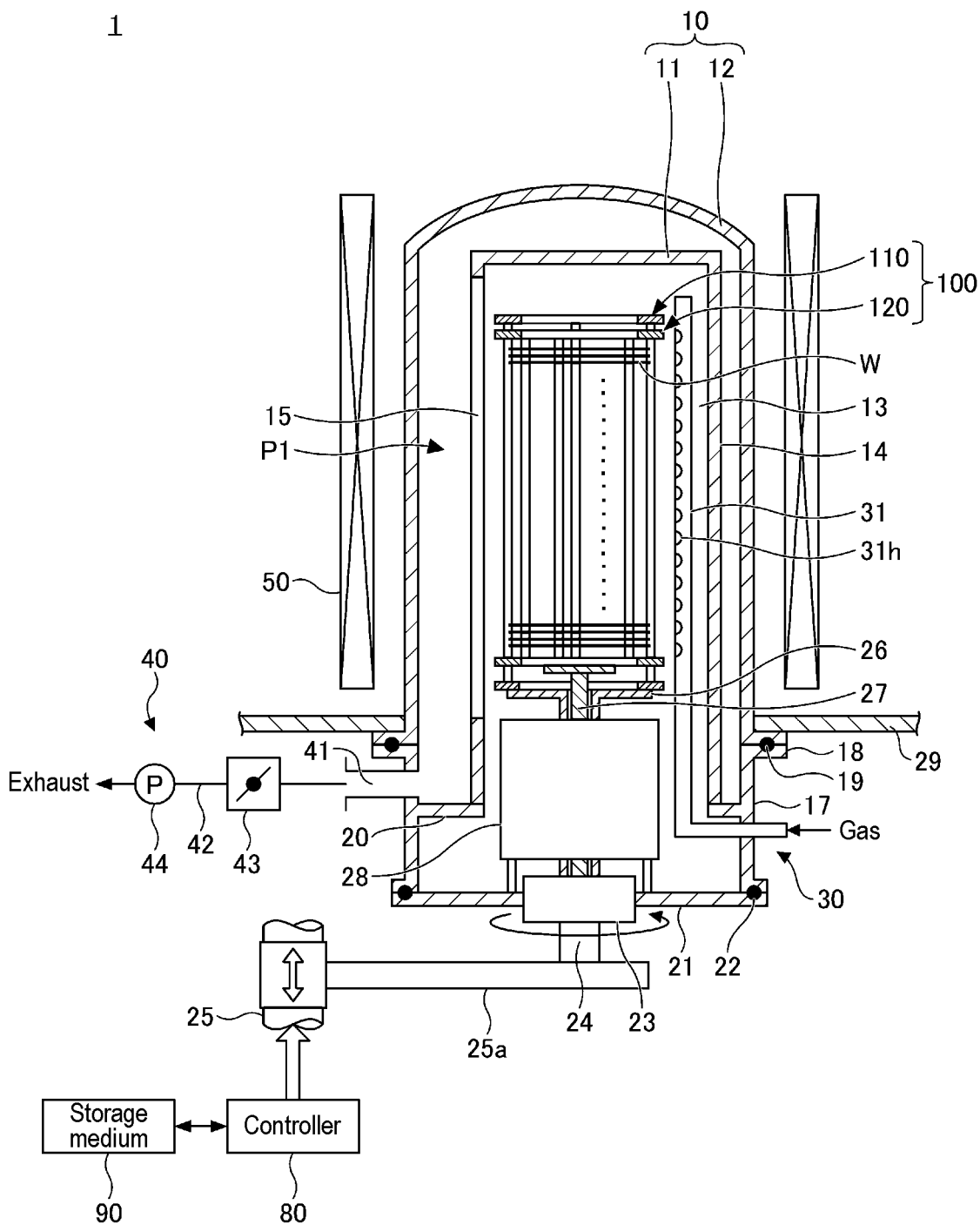
FIG. 1 is a schematic view illustrating an example of a substrate processing apparatus according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, non-limiting exemplary embodiments of the present disclosure will be described with reference to the accompanying drawings. In all of the accompanying drawings, the same or corresponding members or components will be denoted by the same or corresponding reference numerals, and redundant descriptions will be omitted.

[Sticking of Substrate]

When a substrate is placed on claws provided on a boat and a film forming process is performed on the substrate by accommodating a boat with the substrate placed therein in a processing container, the substrate may stick to the claws. In particular, when a thick polysilicon film is formed on the substrate, the substrate easily sticks to the claws.

As an example of a measure to prevent a substrate from sticking to the claws, there is a technique to reduce the contact area between the claws and the substrate by forming fine irregularities on the surface of the claws. However, when the film thickness formed on the substrate is increased, the substrate may stick to the claws even if the above technique is applied.

The present disclosure provides a technique capable of preventing a substrate from sticking to a boat by using a substrate holder including a first boat and a second boat that are movable up and down relative to each other, wherein the substrate is capable of being delivered between the first boat and the second boat. Details will be described below.

[Substrate Processing Apparatus]

An example of a substrate processing apparatus of an embodiment will be described with reference to FIG. 1. The substrate processing apparatus of the embodiment is a batch-type apparatus that processes a plurality of substrates at once.

The substrate processing apparatus 1 includes a processing container 10, a gas supply 30, an exhaust part 40, a heater 50, and a controller 80.

The interior of the processing container 10 can be depressurized. The processing container 10 accommodates substrates W. The substrates W are, for example, semiconductor wafers. The processing container 10 includes an inner tube 11 and an outer tube 12. The inner tube 11 has a substantially cylindrical shape with a ceiling and an open lower end. The outer tube 12 has a substantially cylindrical shape with a lower open end and a ceiling and covers the exterior of the inner tube 11. The inner tube 11 and the outer tube 12 are formed of a heat-resistant material such as quartz, and are arranged coaxially so as to form a double-tube structure.

The ceiling of the inner tube 11 is, for example, flat. An accommodation section 13 configured to accommodate a gas nozzle along the longitudinal direction thereof (vertical direction) is provided at one side of the inner tube 11. The accommodation section 13 is a region within a convex portion 14 formed by making a portion of the side wall of the inner tube 11 protrude outward.

In the side wall of the inner tube 11 opposite to the nozzle accommodation section 13, a rectangular opening 15 is provided in the longitudinal direction thereof (the vertical direction).

The opening 15 is a gas exhaust port provided to be capable of exhausting the gas within the inner tube 11. The length of the opening 15 is the same as the length of a substrate holder 100, or extends in the vertical direction to be longer than the length of the substrate holder 100.

The lower end of the processing container 10 is supported by a substantially cylindrical manifold 17 formed of, for example, stainless steel. A flange 18 is formed at the upper end of the manifold 17, and the lower end of the outer tube 12 is installed on and supported by the flange 18. A sealing member 19, such as an O-ring, is interposed between the flange 18 and the lower end of the outer tube 12 so as to hermetically seal the interior of the outer tube 12.

A support portion 20 having a substantially annular shape is provided on the inner wall of the upper portion of the manifold 17. The lower end of the inner tube 11 is installed on and supported by the support part 20. A lid 21 is hermetically installed at the opening at the lower end of the manifold 17 via a sealing member 22 such as an O-ring. The lid 21 has a substantially disk-like shape and hermetically closes the opening at the lower end of the processing container 10, that is, the opening of the manifold 17. The lid 21 is formed of, for example, stainless steel.

In the central portion of the lid 21, a rotation shaft 24 that rotatably supports the substrate holder 100 is provided through a sealing member 23 such as a magnetic fluid seal. The lower portion of the rotation shaft 24 is rotatably supported by an arm 25a of a lifting mechanism 25 configured as a boat elevator.

An outer support 26 and an inner support 27 are provided at the upper end of the rotation shaft 24. The outer support 26 has a substantially cylindrical hollow shape. The outer support 26 supports the first boat 110. The inner support 27 has a solid columnar shape and is inserted into the outer support 26. The inner support 27 supports the second boat 120.

The outer support 26 and the inner support 27 rotate in synchronization with the rotation of the rotation shaft 24, and as a result, the first boat 110 and the second boat 120 rotate in synchronization with each other. The lid 21, the rotation shaft 24, the outer support 26, the inner support 27, the first boat 110, and the second boat 120 move up and down integrally in response to the raising and lowering of the lifting mechanism 25, and as a result, the first boat 110 and the second boat 120 are inserted into and removed from the interior of the processing container 10.

The inner support 27 is configured to move up and down relative to the outer support 26. As a result, the second boat 120 moves up and down relative to the first boat 110.

The first boat 110 and the second boat 120 constitute the substrate holder 100 that holds a plurality of (for example, 50 to 150) substrates W in a shelf-like manner. The details of the substrate holder 100 will be described later.

A heat insulating table 28 is provided on the lid 21. The heat insulating table 28 prevents the substrate holder 100 from being cooled by heat transfer to the lid 21 side, and keeps the substrate holder 100 warm. For example, the heat insulating table 28 has a configuration in which a plurality of quartz plates arranged substantially horizontally at intervals in the vertical direction are installed in a plurality of columns provided on the lid 21.

The gas supply 30 includes a gas nozzle 31. The gas nozzle 31 is made of, for example, quartz. The gas nozzle 31 is provided in the inner tube 11 along the longitudinal direction of the same, and the base end of the gas nozzle 31 is supported by being bent in an L shape to penetrate the manifold 17. The gas nozzle 31 has a plurality of gas holes 31h along the longitudinal direction thereof, and discharges a processing gas from the plurality of gas holes 31h in the horizontal direction. The plurality of gas holes 31h are arranged, for example, at the same intervals as the intervals of the substrates W supported by the substrate holder 100. The type of the processing gas is not limited, and examples thereof include a film forming gas, an etching gas, and a purge gas.

In the example of FIG. 1, the case in which the gas supply 30 includes one gas nozzle 31 has been described, but the number of gas nozzles is not limited. For example, the gas supply 30 may include a plurality of gas nozzles. In this case, the plurality of gas nozzles may be configured to eject the same processing gas, or may be configured to eject different processing gases.

The exhaust part 40 exhausts the gas that is discharged from the interior of the inner tube 11 through the opening 15 and discharged from the gas outlet 41 through a space P1 between the inner tube 11 and the outer tube 12. The gas outlet 41 is formed in the upper sidewall of the manifold 17 and above the support part 20. An exhaust passage 42 is connected to the gas outlet 41. A pressure adjustment valve 43 and a vacuum pump 44 are sequentially interposed in the exhaust passage 42 so as to evacuate the interior of the processing container 10.

The heater 50 is provided around the outer tube 12. The heater 50 is provided, for example, on the base plate 29. The heater 50 has a substantially cylindrical shape so as to cover the outer tube 12. The heater 50 includes, for example, a heating element, and heats the substrates W within the processing container 10.

The controller 80 is configured to control the operation of each part of the substrate processing apparatus 1. The controller 80 may be, for example, a computer. A computer program that operates each part of the substrate processing apparatus 1 is stored in a storage medium 90. The storage medium 90 may be a flexible disk, a compact disk, a hard disk, a flash memory, a DVD, or the like.

[Substrate Holder]

Figure 2:
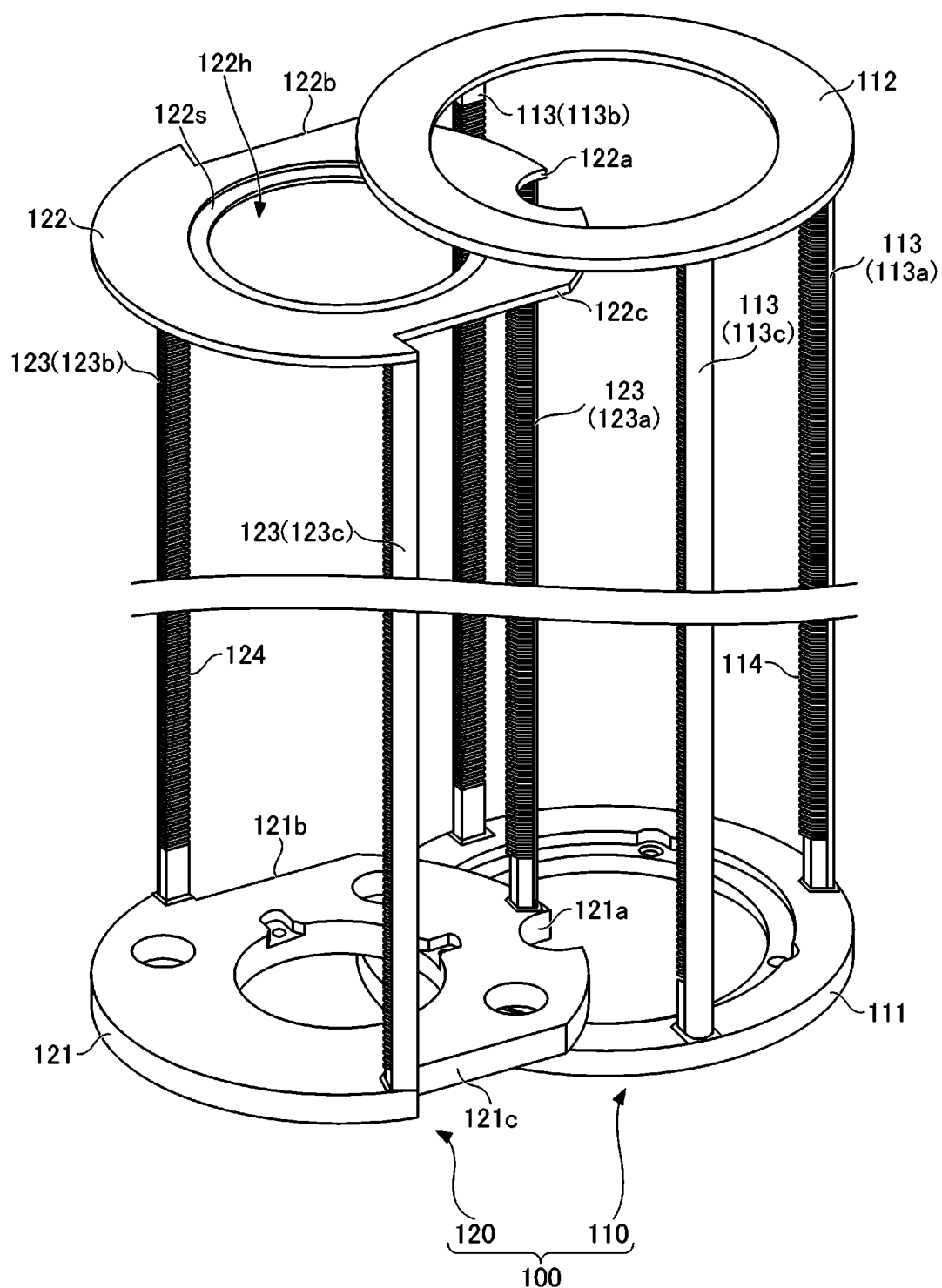
FIG. 2 is a perspective view illustrating an example of a substrate holder.
Figure 3:
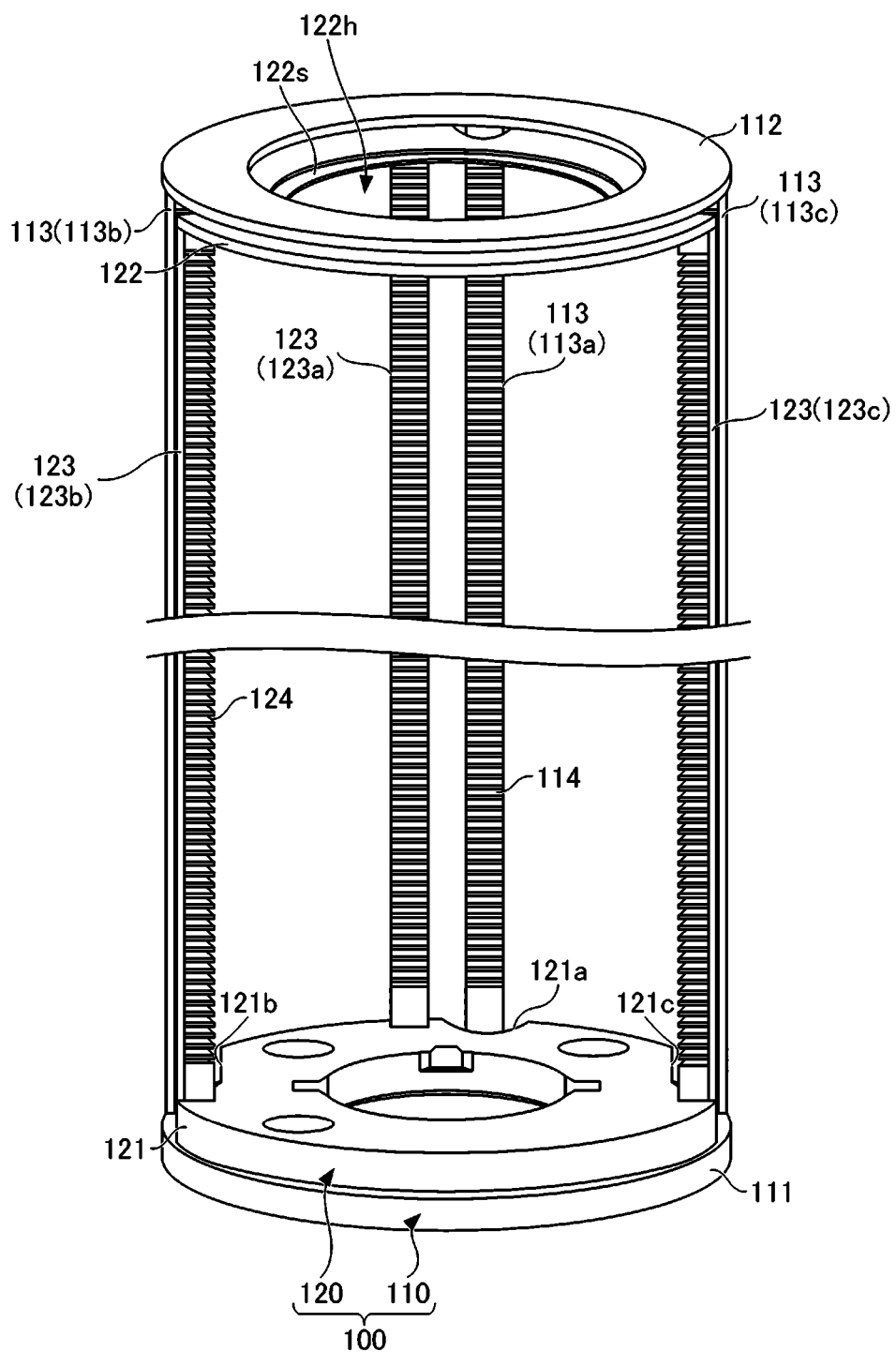
FIG. 3 is a perspective view illustrating an example of a substrate holder.
Figure 4:
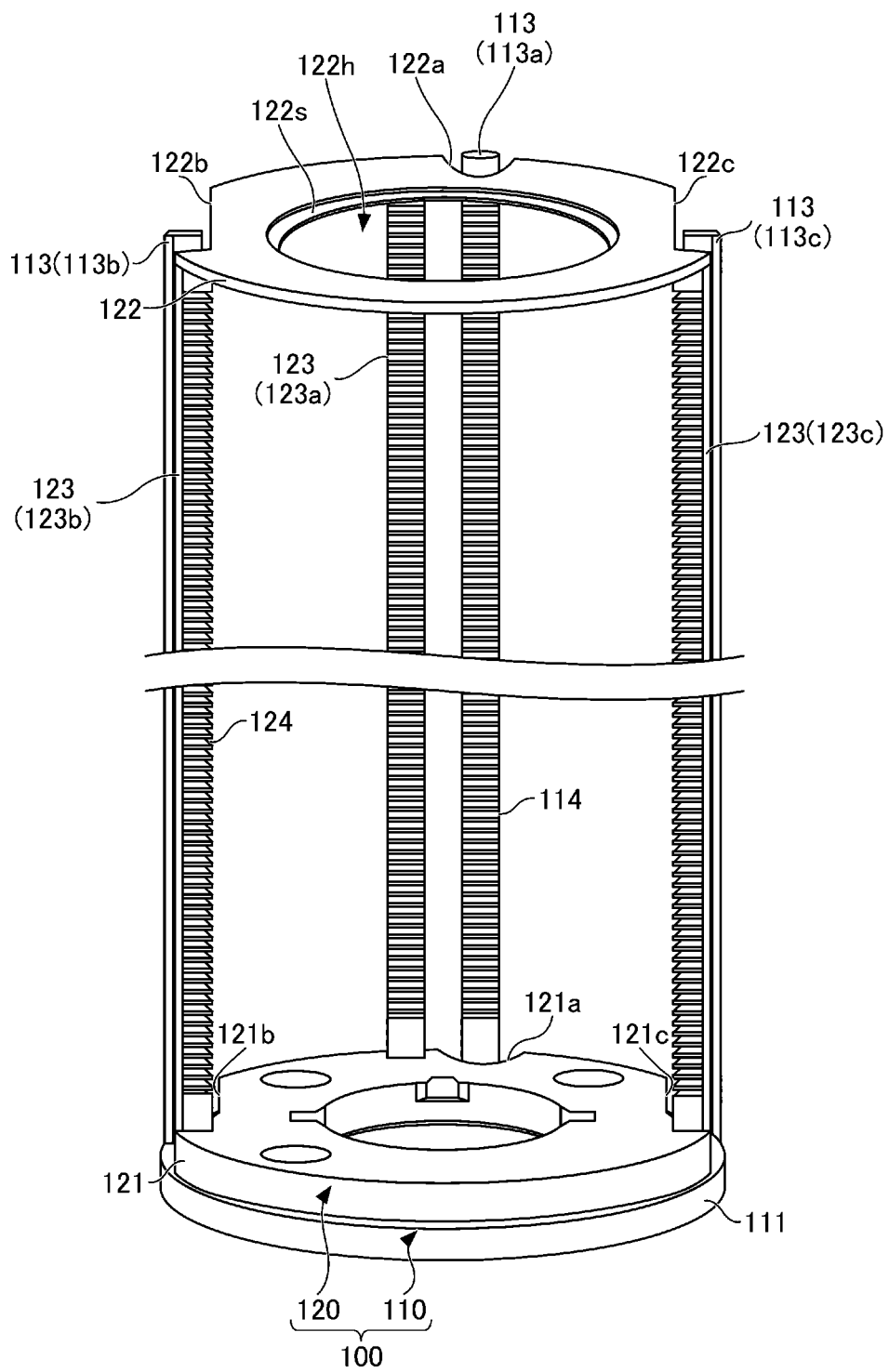
FIG. 4 is a perspective view illustrating an example of a substrate holder.

An example of a substrate holder 100 included in the substrate processing apparatus 1 of the embodiment will be described with reference to FIGS. 2 to 9. FIG. 2 is a perspective view illustrating the substrate holder in a state in which the second boat is being installed in the first boat, and FIGS. 3 and 4 are perspective views each illustrating a state in which the second boat is attached in the first boat. In FIG.

Figure 5:
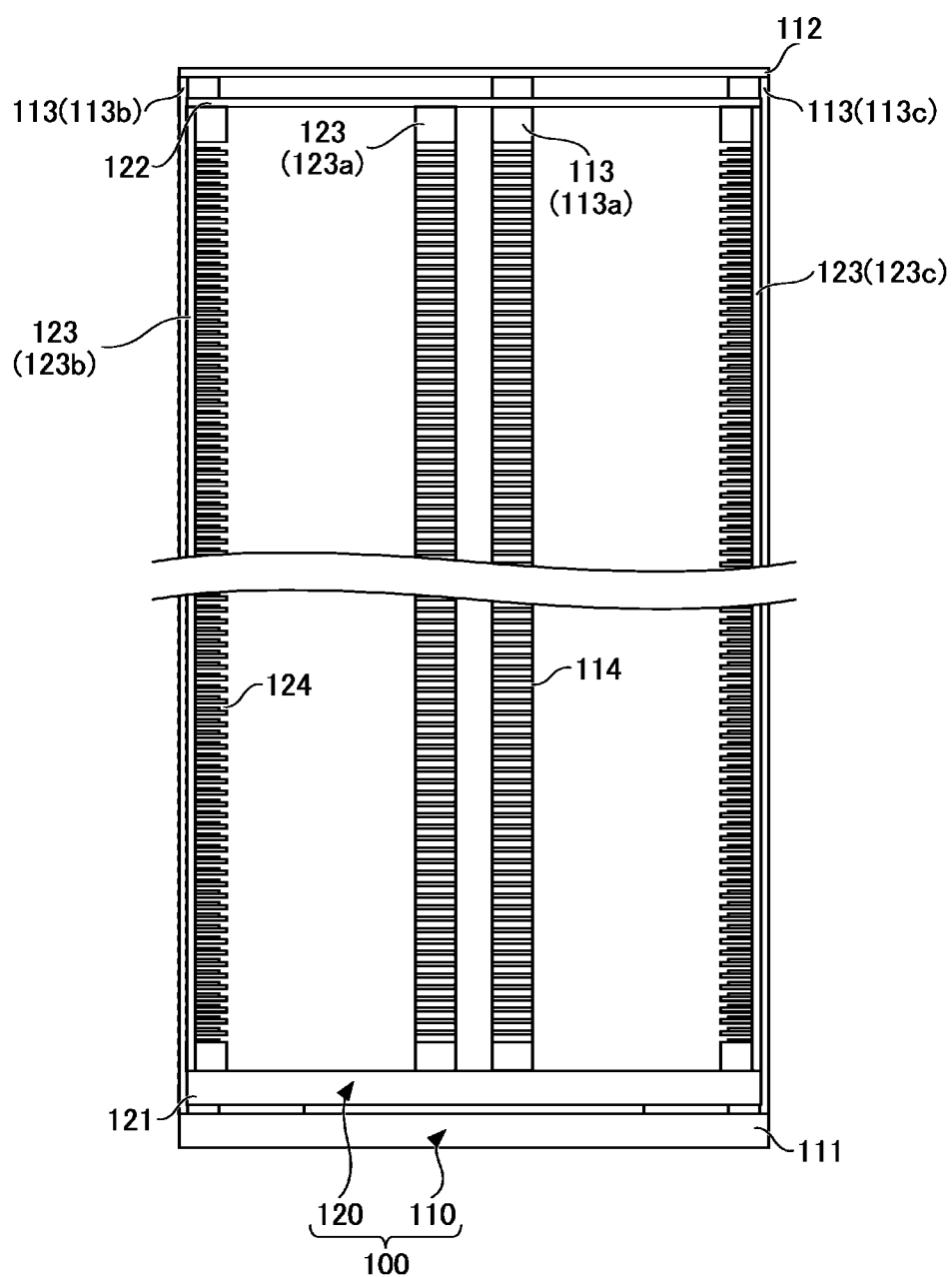
FIG. 5 is a side view illustrating an example of a substrate holder.
Figure 6:
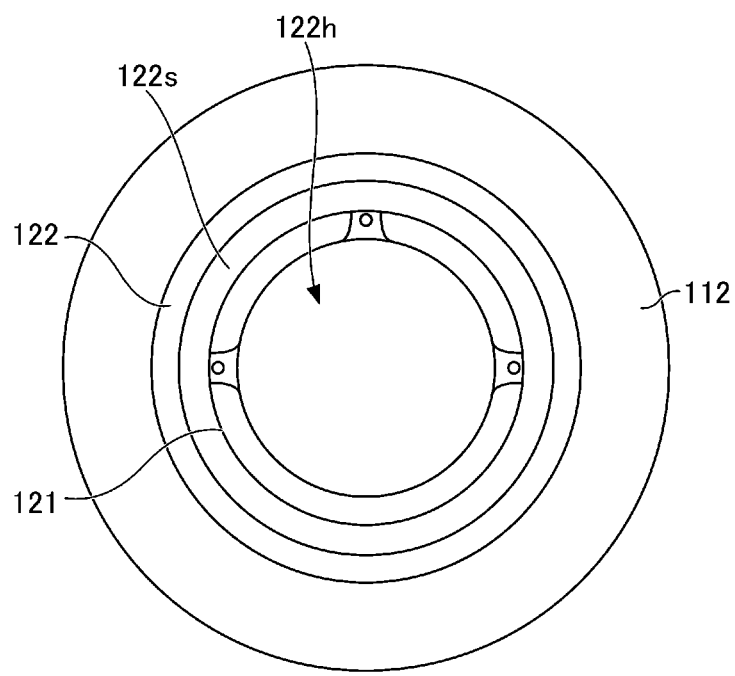
FIG. 6 is a view of the substrate holder of FIG. 3 when viewed from above.
Figure 7:
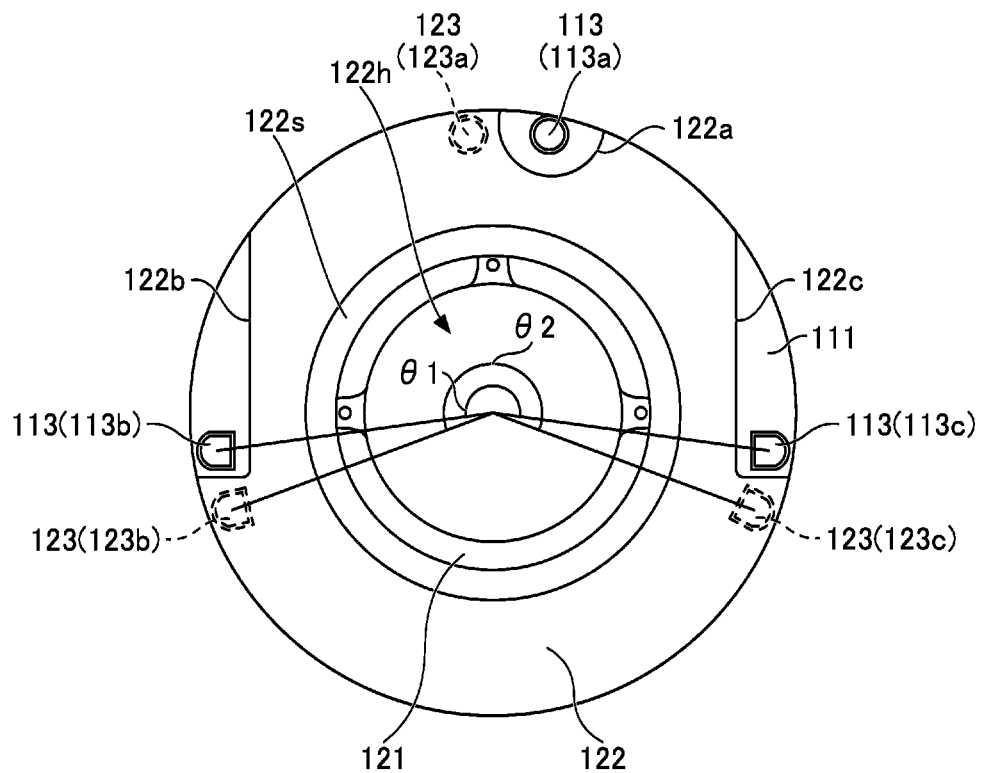
FIG. 7 is a view of the substrate holder of FIG. 4 when viewed from above.
Figure 8:
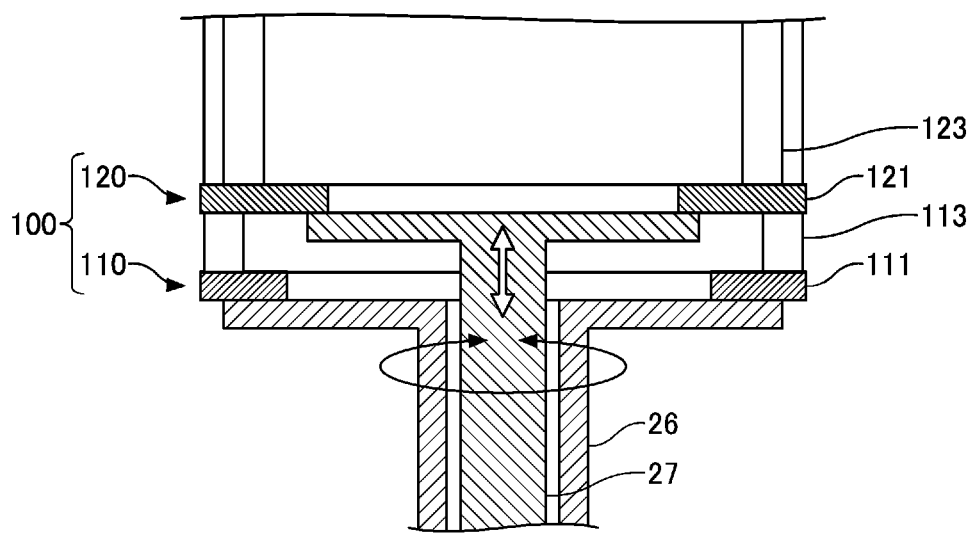
FIG. 8 is a cross-sectional view illustrating a positional relationship between a first boat and a second boat.
Figure 9:
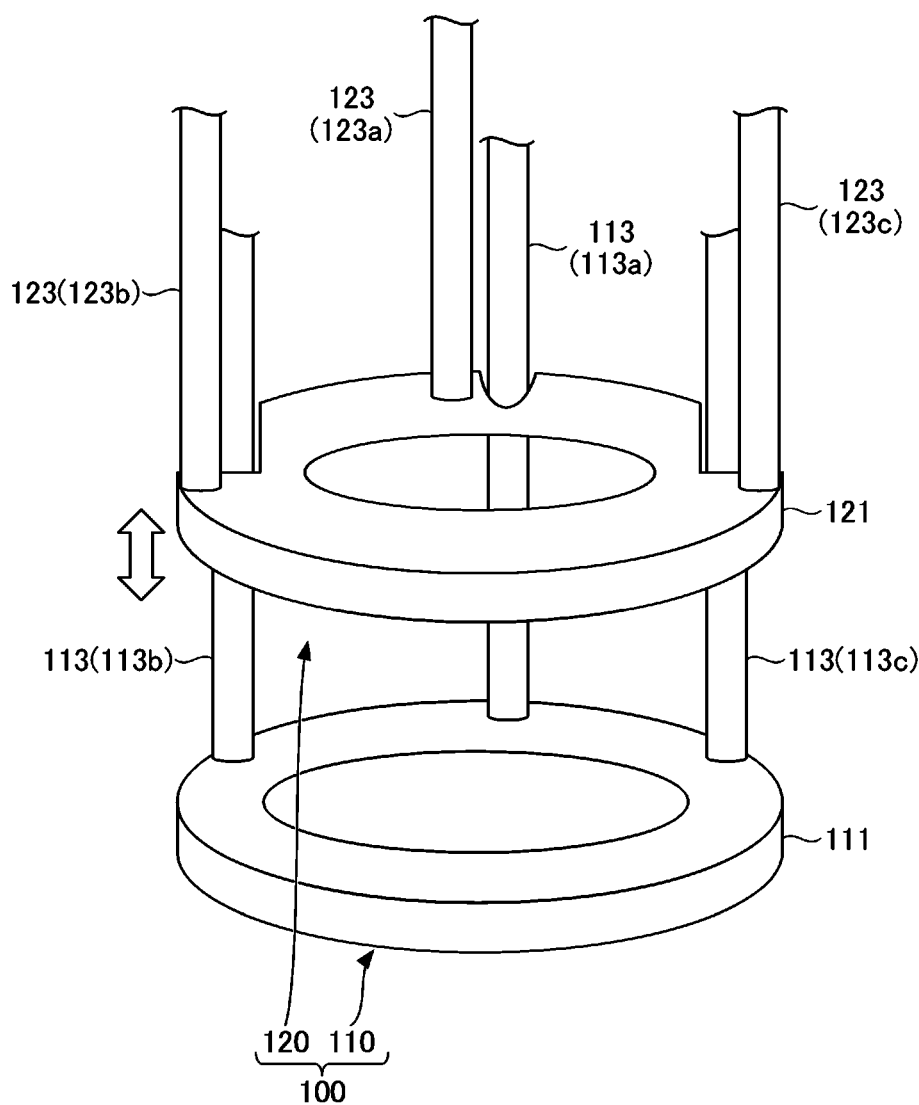
FIG. 9 is a perspective view illustrating the positional relationship between the first boat and the second boat.

4, illustration of the ceiling plate of the first boat is omitted. FIG. 5 is a side view illustrating the substrate holder in a state in which the second boat is installed in the first boat. FIG. 6 is a view of the substrate holder of FIG. 3 when viewed from above, and FIG. 7 is a view of the substrate holder of FIG. 4 when viewed from above. FIG. 8 is a cross-sectional view illustrating a positional relationship between the first boat and the second boat, and FIG. 9 is a perspective view illustrating a positional relationship between the first boat and the second boat.

The substrate holder 100 is capable of being accommodated in the processing container 10 and holds a plurality of substrates substantially horizontally at intervals in the vertical direction. The substrate holder 100 includes a first boat 110 and a second boat 120.

The first boat 110 includes a bottom plate 111, a ceiling plate 112, and support columns 113 (113a to 113c). The bottom plate 111, the ceiling plate 112, and the support columns 113 are formed of a heat-resistant material such as quartz or silicon carbide.

The bottom plate 111 is supported by the outer support 26. The bottom plate 111 has a substantially annular plate shape having an outer diameter larger than the outer diameter of substrates to be held. The bottom plate 111 may have a substantially disk-like shape.

The ceiling plate 112 is provided above the bottom plate 111 to face the bottom plate 111. Like the bottom plate 111, the ceiling plate 112 has a substantially annular plate shape having an outer diameter larger than the outer diameter of a substrate to be held. The ceiling plate 112 may have a substantially disk-like shape.

The support columns 113 have a rod shape extending in the vertical direction, and connect the bottom plate 111 and the ceiling plate 112 to each other. The three columns 113a to 113c have the same length. The columns 113a to 113c are provided such that their center points are located on the same arc of concentric circles. A plurality of grooves 114 are formed in each of the columns 113a to 113c at intervals in the vertical direction. The grooves 114 form placement surfaces 115 (FIGS. 10 and 11) on each of which a substrate is placed. By placing substrates on the placement surfaces 115, the substrates are held by the support columns 113.

In a plan view, a central angle θ1 (FIG. 7) of an arc passing through a center point of the support column 113b, a center point of the column 113a, and a center point of the support column 113c is preferably larger than 180 degrees. As a result, a substrate can be stably held even when a center position of the substrate deviates from a center position of the first boat 110. In a plan view, the central angle θ1 is set to an angle (e.g., 220 degrees) or less that does not hinder the loading of the substrate into the first boat 110.

The second boat 120 is configured to be attachable to/detachable from the first boat 110 through horizontal movement. The second boat 120 is provided coaxially with the first boat 110 and configured to be able to move up and down relative to the first boat 110. The second boat 120 includes a bottom plate 121, a ceiling plate 122, and columns 123 (123a to 123c). The bottom plate 121, the ceiling plate 122, and the support columns 123 are formed of a heat-resistant material such as quartz or silicon carbide.

The bottom plate 121 is supported by the inner support 27 and is arranged above the bottom plate 111. The bottom plate 121 has a substantially annular plate shape having an outer diameter larger than the outer diameter of the substrate to be held, and is disposed to overlap the bottom plate 111 in a plan view. The bottom plate 121 may have a substantially disk-like shape. Notches 121a to 121c through which the columns 113a to 113c are inserted are formed in the outer edge portion of the bottom plate 121. The notches 121a to 121c are formed such that the bottom plate 121 and the columns 113a to 113c do not come into contact with each other when the second boat 120 is horizontally moved and installed in the first boat 110.

The ceiling plate 122 is provided above the bottom plate 121 and below the ceiling plate 112 to face the bottom plate 121. Like the bottom plate 121, the ceiling plate 122 has a substantially annular plate shape having an outer diameter larger than the outer diameter of a substrate to be held. Notches 122a to 122c through which the columns 113a to 113c are inserted are formed in the outer edge portion of the ceiling plate 122. The notches 122a to 122c are formed such that the ceiling plate 122 and the columns 113a to 113c do not come into contact with each other when the second boat 120 is horizontally moved and installed in the first boat 110. A recessed surface 122s is formed in the inner edge portion of the ceiling plate 122. The recessed surface 122s has a top surface lower than the top surface of the ceiling plate 122, and functions as a placement surface for mounting a lid (not illustrated) that closes the opening 122h of the ceiling plate 122. The ceiling plate 122 may have a substantially disk-like shape.

The support columns 123 have a rod shape extending in the vertical direction, and connect the bottom plate 121 and the ceiling plate 122 to each other. The three columns 123a to 123c have the same length. The columns 123a to 123c are provided such that center points thereof are located on the same arc of the same circle as a circle through which the center point of each of the columns 113a to 113c passes. The columns 123a to 123c are shorter than the columns 113a to 113c, respectively. A plurality of groove portions 124 are formed in each of the columns 123a to 123c at intervals in the vertical direction. The groove portions 124 form placement surfaces 125 (FIGS. 10 and 11) on each of which a substrate is placed. By placing substrates on the placement surfaces 125, the substrates are held by the support columns 123.

In a plan view, a central angle θ2 (FIG. 7) of an arc passing through a center of the support column 123b, a center of the support column 123a, and a center of the support column 123c is preferably larger than 180 degrees. As a result, a substrate can be stably held even when the center position of the substrate deviates from the center position of the second boat 120. In a plan view, the central angle θ2 is set to an angle (e.g., 220 degrees) or less that does not hinder the loading of the substrate into the second boat 120.

[Delivery of Substrate]

Figure 10:
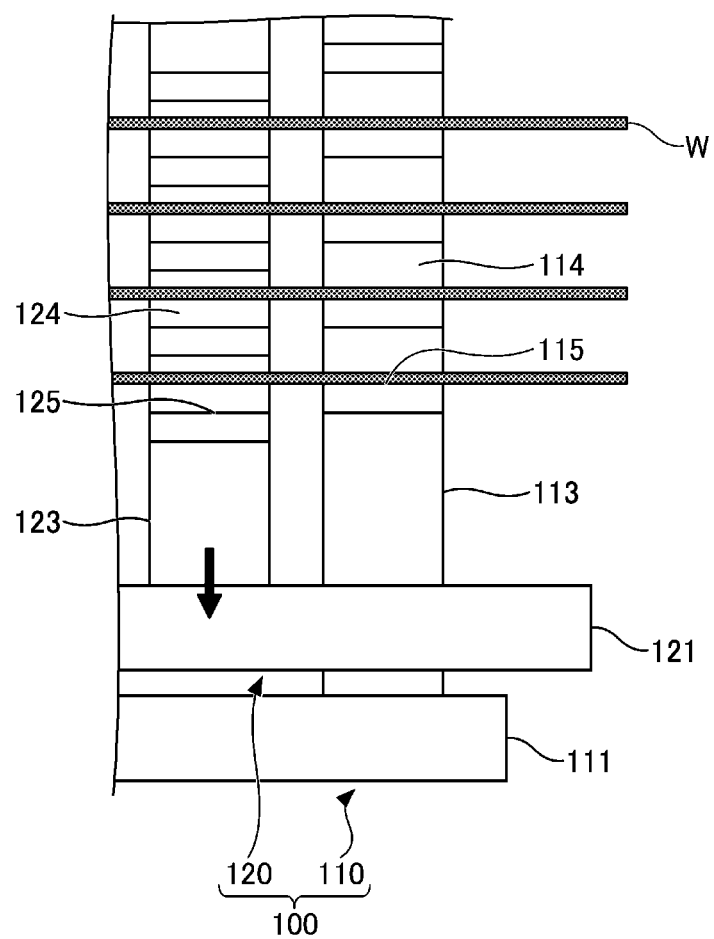
FIG. 10 is a side view illustrating the substrate holder in a state in which substrates are held by the first boat.

An example of delivery of a substrate in the substrate holder 100 will be described with reference to FIGS. 10 and 11. FIG. 10 is a side view showing a substrate holder in a state in which substrates are held by the first boat, and FIG. 11 is a side view illustrating the substrate holder in a state in which substrates are held by the second boat.

When the substrates W are held by the first boat 110, the second boat 120 is lowered until the positions of the placement surfaces 125 are located below the positions of the placement surfaces 115, as illustrated in FIG. 10. As a result, the substrates W are placed on the placement surfaces 115 and separated from the placement surfaces 125.

When the substrates W are held by the second boat 120, the second boat 120 is raised until the positions of the placement surfaces 125 are located above the positions of the placement surfaces 115, as illustrated in FIG. 11. As a result, the substrates W are placed on the placement surfaces 125 and separated from the placement surfaces 115.

For example, when the substrate holder 100, in which the substrates W are held by the first boat 110, is accommodated in the processing container 10 and a film forming process is performed on the substrates W in the processing container 10, the second boat 120 is raised relative to the first boat 110 during the film forming process. As a result, the substrates W held by the first boat 110 are delivered to the second boat 120. In addition, the second boat 120 is lowered relative to the first boat 110 in a state in which the substrates W are held by the second boat 120. As a result, the substrates W held by the second boat 120 are delivered to the first boat 110. In this way, by delivering the substrates W between the first boat 110 and the second boat 120 during the film forming process, the substrates W do not continuously stay on the placement surfaces 115 and the placement surfaces 125. As a result, it is possible to prevent the substrates W from sticking to the placement surfaces 115 and the placement surfaces 125. Further, during the film forming process, the delivery of the substrates W between the first boat 110 and the second boat 120 may be repeated multiple times.

In the above-described embodiment, the bottom plate 111, the ceiling plate 112, the support columns 113, and the placement surfaces 115 are examples of the first bottom plate, the first ceiling plate, the first support column, and the first placement surface, respectively. In addition, the bottom plate 121, the ceiling plate 122, the support columns 123, and the placement surface 125 are examples of the second bottom plate, the second ceiling plate, the second support column, and the second placement surface, respectively.

According to the present disclosure, it is possible to suppress sticking of a substrate to a boat.

The embodiments disclosed herein should be considered to be exemplary in all respects and not restrictive. The above-described embodiments may be omitted, replaced, or modified in various forms without departing from the scope and spirit of the appended claims.

In the above-described embodiments, the case in which the second boat 120 is configured to move up and down relative to the first boat 110 has been described, but the present disclosure is not limited thereto. For example, the first boat 110 may be configured to move up and down relative to the second boat 120. Further, for example, both the first boat 110 and the second boat 120 may be configured to move up and down.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate holder comprising:
a first boat configured to hold a substrate in a shelf-like manner; and
a second boat coaxial with the first boat and provided to move up and down relative to the first boat, the second boat configured to hold the substrate in a shelf-like manner;
wherein the first boat includes a first bottom plate and a first ceiling plate provided to vertically face each other, a first support column connecting the first bottom plate and the first ceiling plate to each other, and a first placement surface on which the substrate is placed,
wherein the second boat includes a second bottom plate and a second ceiling plate provided to vertically face each other, a second support column connecting the second bottom plate and the second ceiling plate, and a second placement surface on which the substrate is placed,
wherein the second ceiling plate is arranged to overlap the first ceiling plate in a plan view, and
wherein the second support column is shorter than the first support column.

2. The substrate holder of claim 1, wherein the second boat is configured to deliver the substrate to and from the first boat by raising and lowering the second placement surface relative to the first placement surface.

3. The substrate holder of claim 2, wherein the first ceiling plate has a substantially annular plate shape or a substantially disk-like shape, and
wherein the second ceiling plate has a substantially annular plate shape or a substantially disk-like shape having an outer diameter equal to the first ceiling plate.

4. The substrate holder of claim 3, wherein a center point of the first support column and a center point of the second support column are provided on a same arc of concentric circles.

5. The substrate holder of claim 4, wherein the second bottom plate is disposed above the first bottom plate, and
wherein the second ceiling plate is disposed under the first ceiling plate.

6. The substrate holder of claim 5, wherein each of the second bottom plate and the second ceiling plate includes a notch through which the first column is inserted.

7. The substrate holder of claim 6, wherein the second boat is configured to be attachable to/detachable from the first boat.

8. The substrate holder of claim 7, wherein the first boat and the second boat are configured to rotate in synchronization with each other.

9. The substrate holder of claim 1, wherein the first ceiling plate has a substantially annular plate shape or a substantially disk-like shape, and
wherein the second ceiling plate has a substantially annular plate shape or a substantially disk-like shape having an outer diameter equal to the first ceiling plate.

10. The substrate holder of claim 1, wherein a center point of the first support column and a center point of the second support column are provided on a same arc of concentric circles.

11. The substrate holder of claim 1, wherein the second bottom plate is disposed above the first bottom plate, and
wherein the second ceiling plate is disposed under the first ceiling plate.

12. The substrate holder of claim 1, wherein each of the second bottom plate and the second ceiling plate includes a notch through which the first column is inserted.

13. The substrate holder of claim 1, wherein the second boat is configured to be attachable to/detachable from the first boat.

14. The substrate holder of claim 1, wherein the first boat and the second boat are configured to rotate in synchronization with each other.

15. A substrate processing apparatus comprising:
a first boat configured to hold a substrate in a shelf-like manner;

a second boat coaxial with the first boat and provided to move up and down relative to the first boat, the second boat configured to hold the substrate in a shelf-like manner; and a processing container configured to accommodate therein the first boat and the second boat, wherein the first boat includes a first bottom plate and a first ceiling plate provided to vertically face each other, a first support column connecting the first bottom plate and the first ceiling plate to each other, and a first placement surface on which the substrate is placed, wherein the second boat includes a second bottom plate and a second ceiling plate provided to vertically face each other, a second support column connecting the second bottom plate and the second ceiling plate, and a second placement surface on which the substrate is placed, wherein the second ceiling plate is arranged to overlap the first ceiling plate in a plan view, and wherein the second support column is shorter than the first support column.

16. A substrate holder comprising:

a first boat configured to hold a substrate in a shelf-like manner; and a second boat coaxial with the first boat and provided to move up and down relative to the first boat, the second boat configured to hold the substrate in a shelf-like manner, wherein the first boat includes a first bottom plate and a first ceiling plate provided to vertically face each other, a first support column connecting the first bottom plate and the first ceiling plate to each other, and a first placement surface on which the substrate is placed, wherein the second boat includes a second bottom plate and a second ceiling plate provided to vertically face each other, a second support column connecting the second bottom plate and the second ceiling plate, and a second placement surface on which the substrate is placed, wherein the second ceiling plate is arranged to overlap the first ceiling plate in a plan view, and wherein each of the second bottom plate and the second ceiling plate includes a notch through which the first column is inserted.

17. A substrate processing apparatus comprising:

a first boat configured to hold a substrate in a shelf-like manner;

a second boat coaxial with the first boat and provided to move up and down relative to the first boat, the second boat configured to hold the substrate in a shelf-like manner; and a processing container configured to accommodate therein the first boat and the second boat, wherein the first boat includes a first bottom plate and a first ceiling plate provided to vertically face each other, a first support column connecting the first bottom plate and the first ceiling plate to each other, and a first placement surface on which the substrate is placed, wherein the second boat includes a second bottom plate and a second ceiling plate provided to vertically face each other, a second support column connecting the second bottom plate and the second ceiling plate, and a second placement surface on which the substrate is placed, wherein the second ceiling plate is arranged to overlap the first ceiling plate in a plan view, and wherein each of the second bottom plate and the second ceiling plate includes a notch through which the first column is inserted.

* * * * *